United States Patent
Bertin et al.

(10) Patent No.: US 6,369,671 B1
(45) Date of Patent: Apr. 9, 2002

(54) VOLTAGE CONTROLLED TRANSMISSION LINE WITH REAL-TIME ADAPTIVE CONTROL

(75) Inventors: Claude L. Bertin, South Burlington; Anthony R. Bonaccio, Shelburne; Howard L. Kalter, Colchester; Thomas M. Maffitt, Burlington, all of VT (US); Jack A. Mandelman, Stormville, NY (US); Edward J. Nowak; William R. Tonti, both of Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/281,412

(22) Filed: Mar. 30, 1999

(51) Int. Cl.$^7$ ............................................. H01P 1/185
(52) U.S. Cl. ..................... 333/164; 257/599; 257/600; 257/601
(58) Field of Search ............... 333/164, 161; 257/599, 600, 601

(56) References Cited

U.S. PATENT DOCUMENTS

| | | | | |
|---|---|---|---|---|
| 3,911,382 A | | 10/1975 | Harth et al. ............ 333/161 X |
| 4,156,249 A | * | 5/1979 | Koo ........................ 257/600 X |
| 4,449,141 A | * | 5/1984 | Sato et al. .............. 257/601 X |
| 4,604,591 A | * | 8/1986 | Vasile ..................... 333/164 X |
| 4,837,532 A | * | 6/1989 | Lang ........................... 333/164 |
| 5,014,018 A | | 5/1991 | Rodwell et al. .............. 333/20 |
| 5,083,100 A | | 1/1992 | Hawkins et al. ............. 333/164 |
| 5,157,361 A | | 10/1992 | Gruchalla et al. ............ 333/20 |
| 5,302,922 A | | 4/1994 | Heidemann et al. .......... 333/18 |
| 5,760,661 A | | 6/1998 | Cohn .......................... 333/164 |
| 6,100,770 A | * | 8/2000 | Litwin et al. ........... 257/601 X |

FOREIGN PATENT DOCUMENTS

| | | | | |
|---|---|---|---|---|
| DE | 3431053 | * | 3/1985 | ................. 257/601 |
| JP | 06-283729 | | 10/1994 | |
| WO | WO 9723001 | | 6/1997 | |

* cited by examiner

Primary Examiner—Benny Lee
(74) Attorney, Agent, or Firm—McGinn & Gibb, PLLC; Mark F. Chadurjian, Esq.

(57) ABSTRACT

A semiconductor structure having a substrate, an insulator above a portion of the substrate, a conductor above the insulator; and at least two contact regions in the substrate on opposite sides of the portion of the substrate, wherein a voltage between the contact regions modulates a capacitance of the conductor.

14 Claims, 7 Drawing Sheets

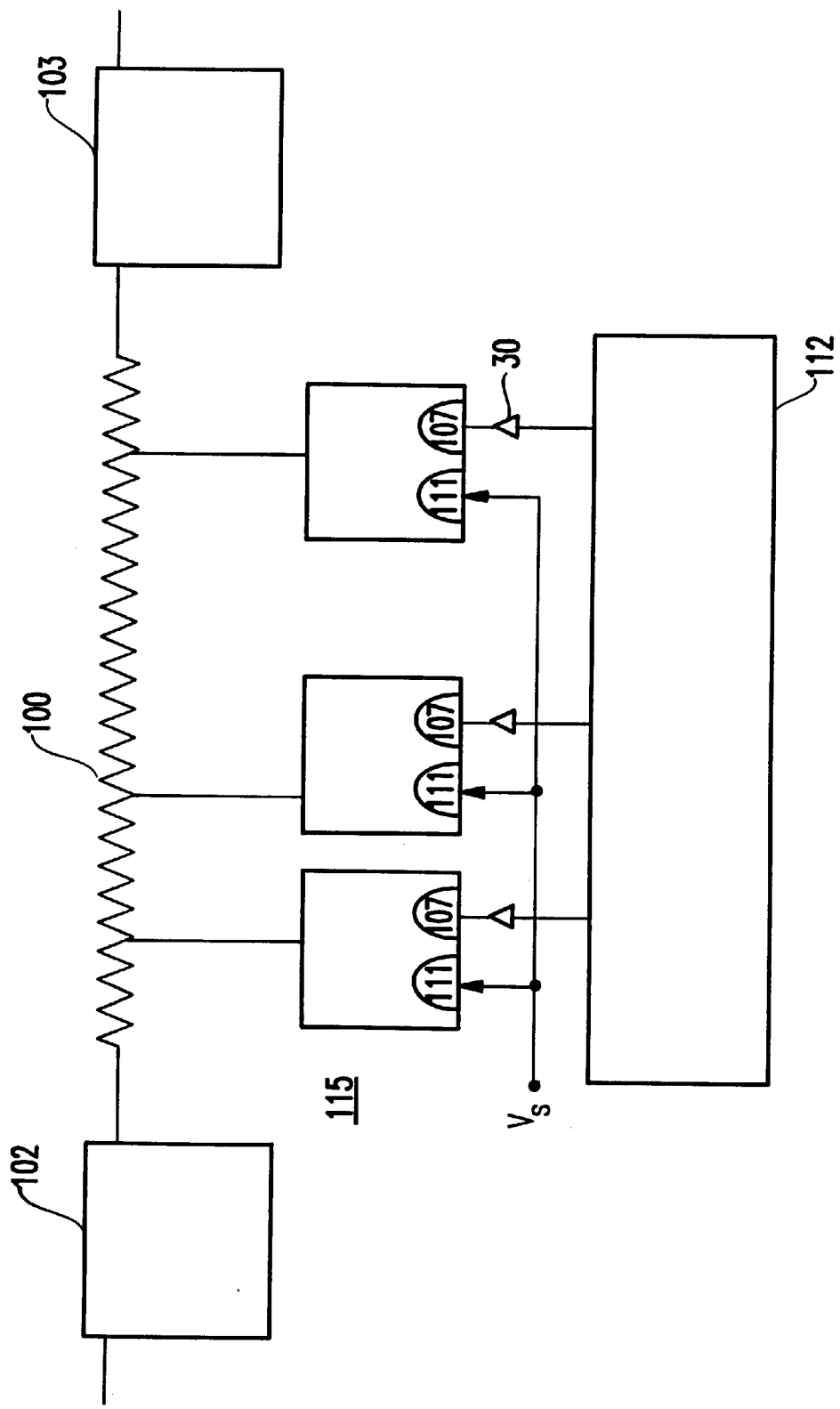

VOLTAGE CONTROLLED TRANSMISSION LINE WITH REAL-TIME ADAPTIVE CONTROL

BACKGROUND OF THE INVENTION

1. Field of the Invention

The present invention generally relates to signal transmission lines and more particularly to adaptive control of the capacitance (and delay) of transmission lines.

2. Description of the Related Art

The propagation characteristics of transmission lines within high-speed digital devices and integrated circuits often need to be adjusted to ensure proper operation of the devices. For example, within integrated circuits, it is often necessary to synchronize clock signals between transmission lines which have fundamentally different delay characteristics. The delay characteristics of transmission lines can be controlled by altering the capacitance of the transmission line. Therefore, there is a need for an electrically variable transmission line on a semiconductor chip which is useful in analog functions, data processing, memory, and telecommunications applications.

Conventionally, the capacitance of a transmission line can be altered by including inductors, capacitors and resistors either in parallel or in series with the transmission line. However, such devices do not offer the ability to dynamically alter the capacitance of the transmission line because the capacitance of the transmission line is permanently changed once such devices are attached to the transmission line.

Additional structures have been designed to dynamically vary the capacitance of a transmission line. In one such device, the capacitance (and delay characteristics) of the transmission line is dynamically changed by connecting capacitive elements such as varactor diodes in parallel with the transmission line. In such a structure, the diodes are selectively energize to add or subtract capacitance to or from the transmission line.

SUMMARY OF THE INVENTION

It is, therefore, an object of the present invention to provide a semiconductor structure having a substrate, an insulator above a portion of the substrate, a conductor above the insulator; and at least two contact regions in the substrate, with at least one of the contacts shared with other similar semiconductor structures, such that a voltage between the contact regions modulates a capacitance of the conductor.

The substrate includes an inversion region below the insulator and a depletion region below the inversion region, wherein the voltage modulates a capacitance of the inversion region. The capacitance of the conductor is equal to the capacitance of the inversion region in series with a capacitance of the insulator.

One of the contact regions is a region of the substrate doped with a first impurity and another of the contact regions is a region of the substrate doped with a second impurity opposite the first impurity.

The contact regions can include contact conductors in trenches adjacent the portion of the substrate, the portion of the substrate includes first impurity regions adjacent the trenches and a second impurity region between the first impurity regions, wherein the first impurity is an opposite type from the second impurity, and the second impurity region is a depletion region below the insulator. Boundaries of the depletion region are controlled by the voltage applied to the contact conductors. Additionally, the conductor can be a plurality of conductors above the portion of the substrate and the voltage applied to the contact conductors independently varies a capacitance of different portions of the depletion region. An important feature of the invention is that the capacitance of the conductor is independent of the voltage of the conductor.

Another embodiment of the invention is a variable capacitance transmission line structure including a substrate, an insulator above a portion of the substrate, a transmission line above the insulator, at least two contact regions in the substrate (such that a voltage between the contact regions modulates a capacitance of the transmission line) and a delay control circuit supplying the voltage to the contact regions.

The substrate includes an inversion region below the insulator and a depletion region below the inversion region, wherein the voltage modulates a capacitance of the inversion region. The capacitance of the transmission line is equal to the capacitance of the inversion region in series with a capacitance of the insulator.

One of the contact regions is a region of the substrate doped with a first impurity and another of the contact regions is a region of the substrate doped with a second impurity opposite the first impurity. At least one contact region is shared with more than one structure. The contact regions include contact conductors in trenches adjacent the portion of the substrate, the portion of the substrate includes first impurity regions adjacent the trenches and a second impurity region between the first impurity regions, wherein the first impurity is an opposite type from the second impurity; and the second impurity region is a depletion region below the insulator. Boundaries of the depletion region are controlled by the voltage applied to the contact conductors. Also, the transmission line can be a plurality of transmission lines above the portion of the substrate and the voltage applied to the contact conductors independently varies a capacitance of different portions of the depletion region. As mentioned above, an important feature is that the capacitance of the transmission line is independent of the voltage of the transmission line.

Another embodiment of the invention is a three terminal varactor that includes a substrate, an insulator above a portion of the substrate, a first contact above the insulator, a second contact in the substrate, a third contact in the substrate, such that a voltage between the second contact and the third contact modulates a capacitance between the first contact and the second contact.

The substrate includes an inversion region below the insulator and a depletion region below the inversion region, wherein the voltage modulates a capacitance of the inversion region. The capacitance between the first contact and the second contact is equal to the capacitance of the inversion region in series with a capacitance of the insulator. The second contact is a region of the substrate doped with a first impurity and the third contact is a region of the substrate doped with a second impurity opposite the first impurity. With the inventive three terminal varactor, the capacitance of the conductor is independent of the voltage of the conductor.

In another embodiment the invention comprises an integrated circuit chip that includes a signal line carrying signals and having a delay associated with it, at least one charge region having a controllable charge density near the signal line, and a modulation circuit coupled to the charge region for dynamically controlling the charge density in the charge region for adjusting the delay associated with the signal line.

The charge region includes an inversion region adjacent the signal line, wherein the modulation circuit modulates a capacitance of the inversion region.

The capacitance of the signal line is equal to the capacitance of the inversion region in series with a capacitance of an insulator adjacent the signal line. Further, the capacitance of the signal line is independent of a voltage of the signal line.

The invention also includes a three terminal varactor comprising a silicon body region, an anode terminal coupled to the silicon body region, a receiving terminal for receiving a signal, for receiving a bias, and having a capacitance between itself and the anode terminal (the bias for controlling a capacitance range between the receiving terminal and the anode terminal), and a control terminal coupled to the silicon body region for adjusting the capacitance within the capacitance range. The capacitance of the receiving terminal is independent of the bias.

BRIEF DESCRIPTION OF THE DRAWINGS

The foregoing and other objects, aspects and advantages will be better understood from the following detailed description of preferred embodiments of the invention with reference to the drawings, in which:

FIG. 3B is a schematic diagram of a structure using a D/A converter and delay control circuits;

DETAILED DESCRIPTION OF PREFERRED EMBODIMENTS OF THE INVENTION

Figure 1A:
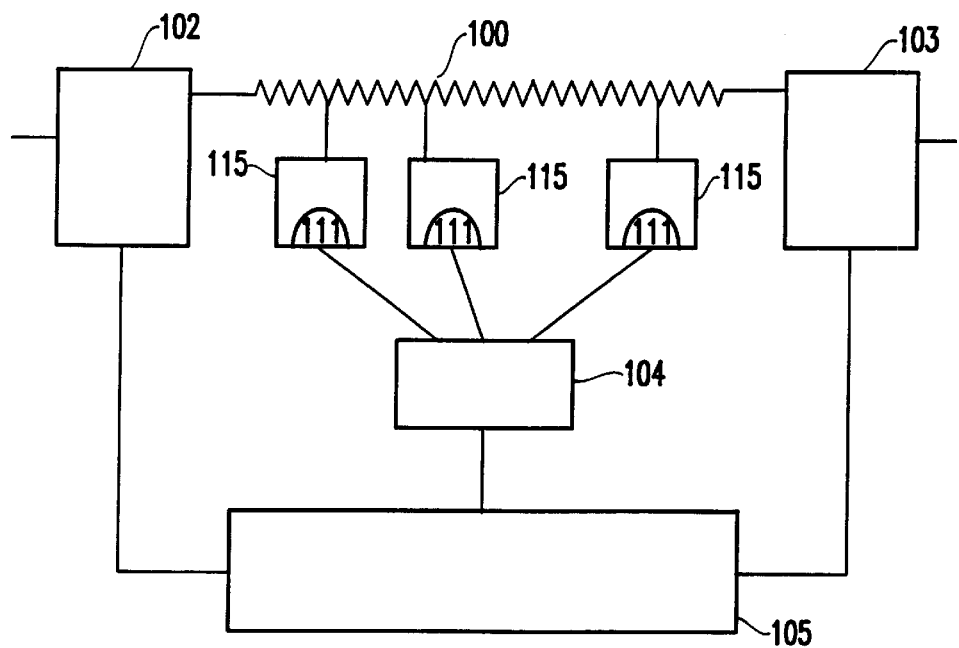
FIG. 1A is a schematic diagram of a transmission line delay circuit.

Referring now to the drawings (which identify the same/similar features with the same numbers without further description), FIGS. 1A–D illustrate a delay modulation circuit which addresses the aforementioned need for an electrically variable transmission line (e.g., signal line) on a semiconductor chip. More specifically, FIGS. 1A shows a transmission line 100 having transmission line elements 115 which dynamically vary the capacitance of the transmission line 100. The transmission line 100 runs between a send unit 102 and a receive unit 103. A delay control circuit 105 (which is connected to the send unit 102 and the receive unit 103) and a capacitance modulating circuit 104 control the transmission line elements 115. Thus, the capacitance modulating circuit 104 controls the transmission line elements 115 to vary the capacitance of the transmission line 100 under the direction of the delay control circuit 105.

Figure 1B:
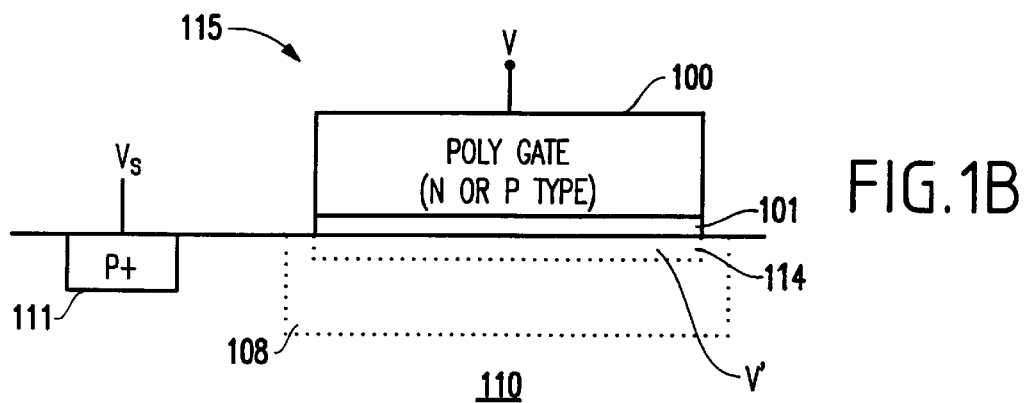
FIG. 1B is a schematic diagram of a transmission line delay circuit.

FIG. 1B shows a cross-section of one of the transmission line elements 115. Each transmission line element 115 includes the conductive line 100, which can be, for example, a polysilicon gate 100, (e.g., N or P type) separated from a P-doped substrate 110 by a thin oxide layer 101.

The oxide layer 101 has a capacitance per unit length referred to herein as Cox. When the polysilicon 100 is biased, the capacitance of the polysilicon 100 is equal to the oxide 101 capacitance (Cox) because the substrate region 110 acts as one plate of a capacitor and the polysilicon line 100 acts as the other plate of the capacitor. If the substrate 1 10 below the polysilicon gate 100 is depleted, then the capacitance of the polysilicon gate 100 is the oxide 101 capacitance (Cox) in series with a depletion region 108 capacitance (Cdep), as shown schematically in FIG. 1C.

As shown in FIGS. 1A and 1B, the transmission line element 115 also includes a P+ doped substrate contact 111 connected to the capacitance modulating circuit 104 (FIG. 1A). This contact 111 is common to many structures on the chip and need not be adjacent to the transmission line 100 (FIG. 1B). The structure shown also includes a surface inversion region 114. The substrate contact 111 is at potential Vs, which may be ground. In order to have inversion, the gate 100 voltage V must be greater than the threshold voltage Vth of the transmission line element 115.

The thin oxide 101 capacitance Cox is independent of voltage V applied to the transmission line 100, while the depletion region 108 capacitance Cdep, in the substrate region, is dependent on the applied voltage Vs. The larger the voltage across the depletion region 108, (FIG. 1B) the smaller the value of the capacitor Cdep.

Figures 1C, 1D:
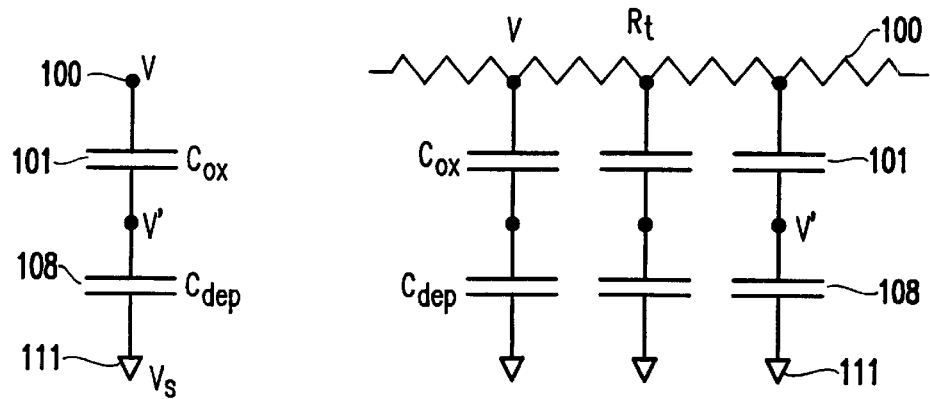
FIG. 1C is a schematic diagram of a transmission line delay circuit.
FIG. 1D is a schematic diagram of a transmission line delay circuit.

FIG. 1C and 1D schematically illustrate the capacitance of the oxide 101 and the depletion region 108. As can be seen from FIG. 1D, the total capacitance per unit length of the transmission line the Cox in series with Cdep. Thus, the capacitance per unit length for the transmission line is Ct=(Cox)(Cdep)/(Cox+ Cdep).

The voltage V' (FIG. 1B) is the voltage of a surface inversion region 114. The inversion region 114 is isolated and, therefore, the voltage V' (FIG. 1B) is determined by the value of the applied transmission line voltage V, and the relative value of Cox and Cdep.

While the structure shown in FIGS. 1A–1D provides variable control of the impedance of the transmission line 100, the device only has two terminals (e.g., contact 111 and gate 100). Therefore, the device 105 relies upon the voltage V to modulate the delay properties of the transmission line 100. Typically, the largest value of Cdep will be approximately Cox/5 for a relatively low applied voltage V, and will decrease to Cox/10 for relatively high voltage values. Thus, with the structure shown in FIGS. 1A–1D, the Ct of the transmission line can be varied by a maximum of less than two times over the operating voltage range.

In view of the foregoing, the invention also includes the structure shown in FIGS. 2A–2E. The features shown in FIGS. 2A–2D that are similar to those discussed above with respect to FIGS. 1A–1D are identified using the same numbering and a redundant discussion of the same is omitted. However, FIGS. 2A–2D illustrates the addition of a third terminal, referred to herein as a control node 107.

Figure 2A:
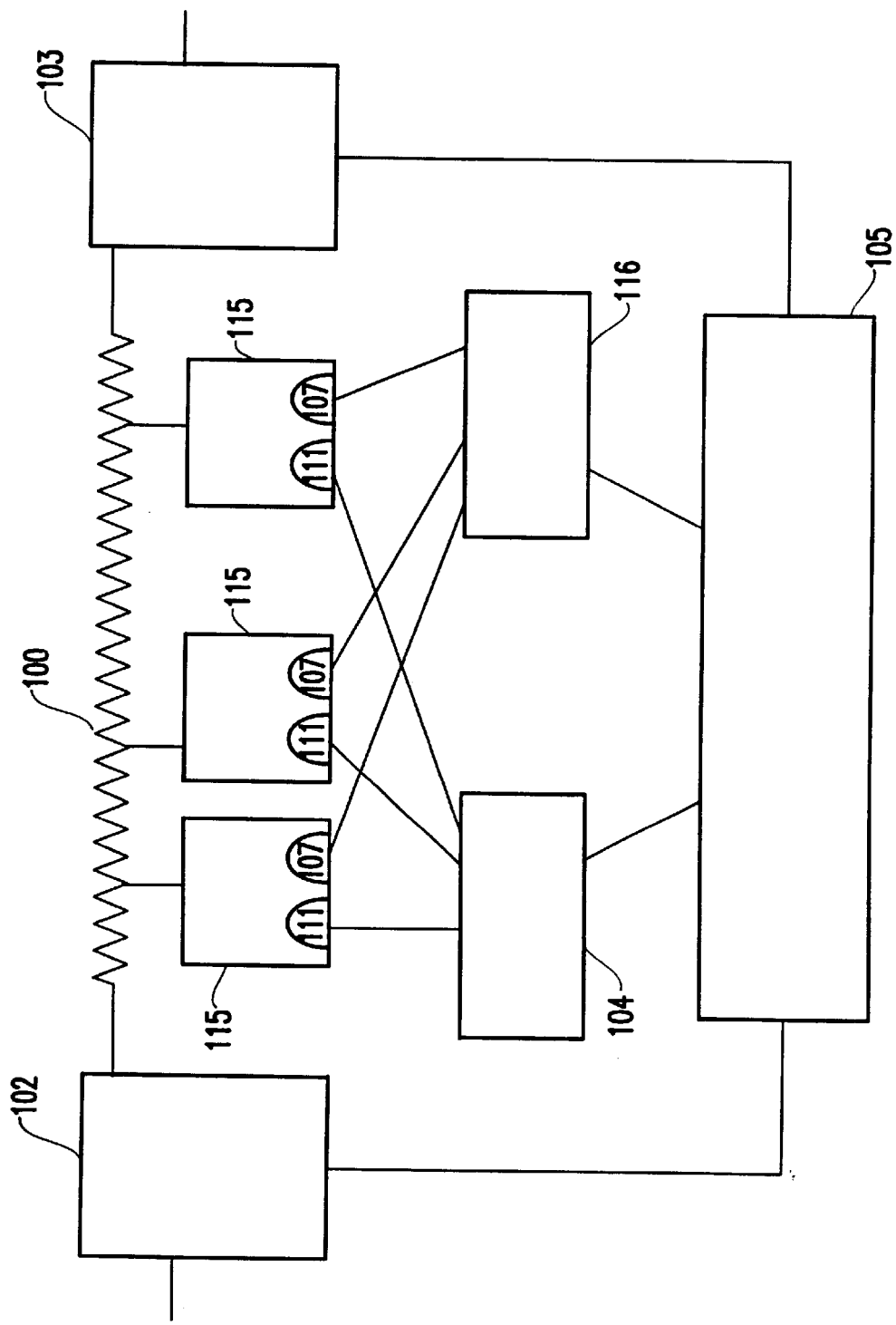
FIG. 2A is a schematic diagram of a transmission line delay circuit.

In addition, FIG. 2A illustrates a second capacitance modulating circuit 116 connected to the delay control circuit 105 and to the control nodes 107 within each of the transmission line elements 115. As would be known by one ordinarily skilled in the art given this disclosure, the second capacitance modulating circuit 116 could be, but does not need to be, separate from the first capacitance modulating circuit 104 and the second capacitance modulating circuit 116 (FIG. 2A) is illustrated separately to allow a more thorough understanding of the invention.

The control node 107 is coupled to the inversion region 114 (FIG. 2B) below the gate 100 so that V' is controlled by the control voltage Vc and is independent of the transmission line 100 voltage V. In order to avoid significant loading in the inversion layer 114, a resistance, R, is added in series with voltage source Vc. For example, a typical value of the series resistance, R, is 100,000 ohms.

With the structure shown in FIGS. 2A–2D, the value of the voltage dependent capacitor 108 Cdep is now a function of the control voltage Vc, not the transmission line voltage V. This allows much greater flexibility of delay control and a broader capacitance modulation range. For example, the transmission line voltage V can remain unchanged, while control voltage Vc is used to change the value of depletion capacitor 108 Cdep and thus of the delay of the transmission line 100.

Additionally, with the structure shown in FIGS. 2A–2D, the Cdep can be varied over an even larger range. For example, the control voltage Vc can be −0.5 volts without incurring substantial (forward biased junction) current on the control node 107 relative to the substrate. With the applied electric field opposing the substrate 110 gradient electric field, Cdep can be greater than Cox. Even assuming Cdep is approximately equal to Cox for Vc+−0.5 volts, and assuming the minimum Cdep is approximately equal to Cox/10, the range of Ct is increased to approximately 5.5 times the capacitance of the oxide layer 101 alone. Therefore, introducing control node 107 increases the range of Ct from less than 2:1 with the structure shown in FIGS. 1A–1D to greater than 5:1 with the structure shown in FIGS. 2A–2D, which is a 2.5 multiple improvement. In addition, the voltage V applied to the transmission line does not have to be modulated because the control voltage Vc is modulated instead.

Figure 2B:
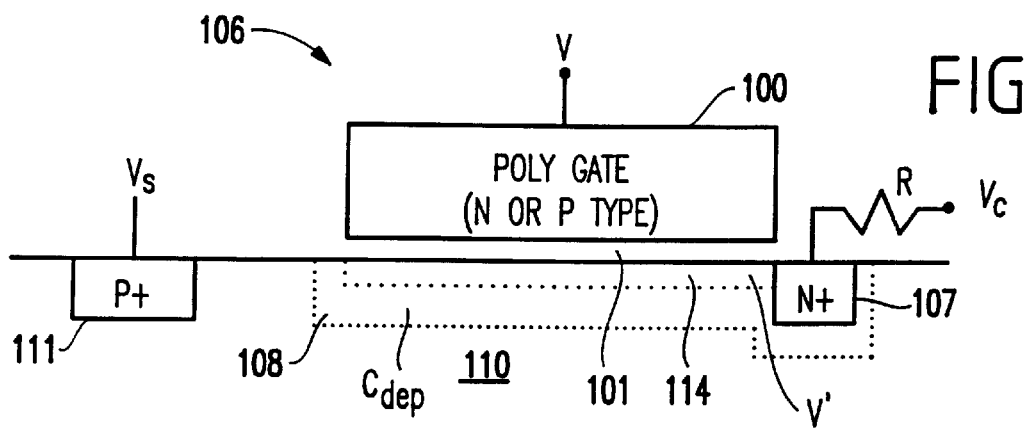
FIG. 2B is a schematic diagram of a transmission line delay circuit.
Figure 2C:
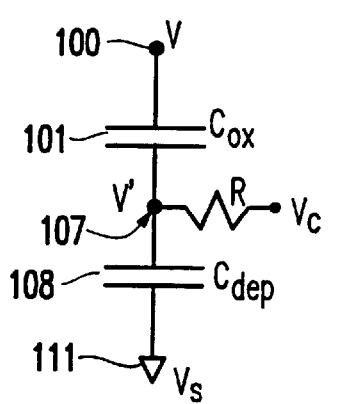
FIG. 2C is a schematic diagram of a transmission line delay circuit.
Figure 2D:
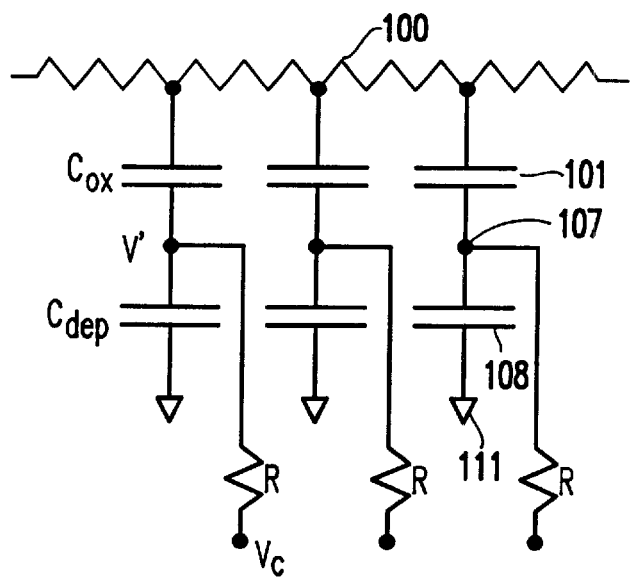
FIG. 2D is a schematic diagram of a transmission line delay circuit.
Figure 2E:
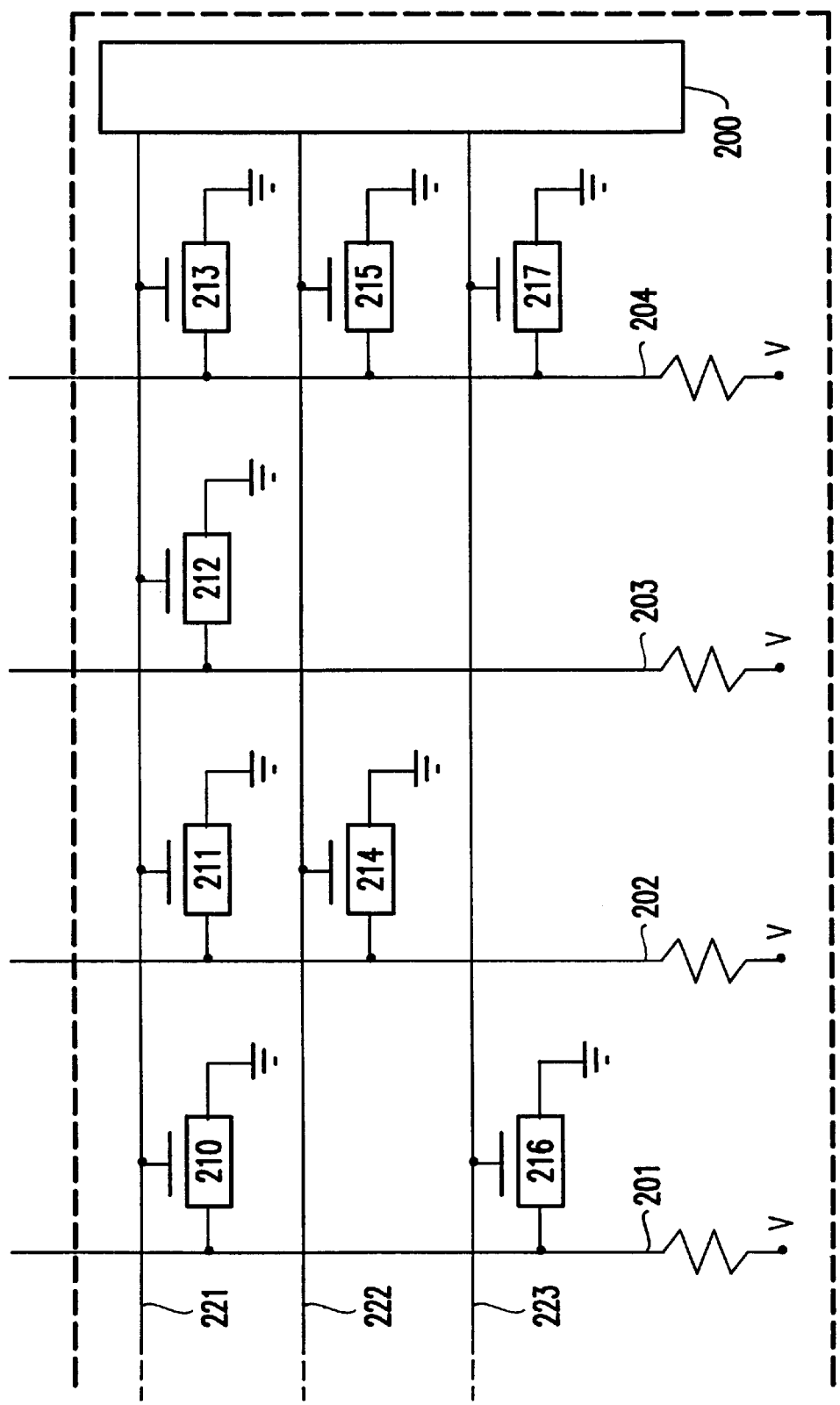
FIG. 2E is a schematic diagram of a transmission line delay circuit.

Additionally, an example of one capacitance modulating circuit 104 is illustrated in greater detail in FIG. 2E. The capacitance modulating circuit 104 includes voltage supply lines 201, 202, 203, 204, transistors 215, 216, 217 (such as field effect transistors), a selection circuit 200, and selection lines 221, 222, 223. The transistors 210–217 selectively pass the voltage along the voltage supply lines 201–204 to the control nodes 107.

For example, if the selection circuit 200 activates selection line 221, transistors 210, 211, 212 and 213 are energized and voltage lines 201, 202, 203 and 204 are grounded, decoupling voltage V from the switch 107. Similarly, if selection line 222 is activated, transistors 214 and 215 are energized and both voltage lines 202 and 204 are grounded, decoupling voltage V from their respective control nodes 107. Also, if transmission line 223 is activated, transistors 216 and 217 are energized and both voltage lines 201 and 204 are grounded, decoupling voltage V from their respective control nodes 107.

While the capacitance modulating circuit 104 is illustrated with a selection circuit 200 and a given number of transistors 210–217, as would be known by one of ordinary skilled in the are given this disclosure, any equivalent circuit of any size may be constructed to selectively pass voltage to each any number of control nodes 107 and the invention is not limited to the specific structure illustrated in the drawings. For example, the capacitance modulating circuit may be a read only memory (ROM) an electronically erasable programable read only memory (EEPROM—variable nonvolatile storage), organized as a programable logic array (PLA) or a storage element such an synchronous random access memory SRAM cell, etc.

Thus, the capacitance modulating circuit 104 selectively supplies voltage to the control nodes 107. When one of the control nodes 107 receives voltage from the capacitance modulating circuit 104, it switches the capacitance of the transmission line 100. Therefore, by activating different control nodes 107, the capacitance (and delay characteristics) of the transmission line 100 can be dynamically changed according to the different needs of the send unit 102 and the receive unit 103.

In other words, the selection circuit 104, under the control of the delay control circuit 105 selectively supplies voltage to the control nodes 107 by varying the activation of the transistors 210–217. Thus, the waveform rise/fall times are spread over numerous elements and many delay increments are possible. The addition of control node 107 increases the range of possible capacitance modulation and modulation using the control voltage Vc with transmission line voltage V unchanged.

Figure 3A:
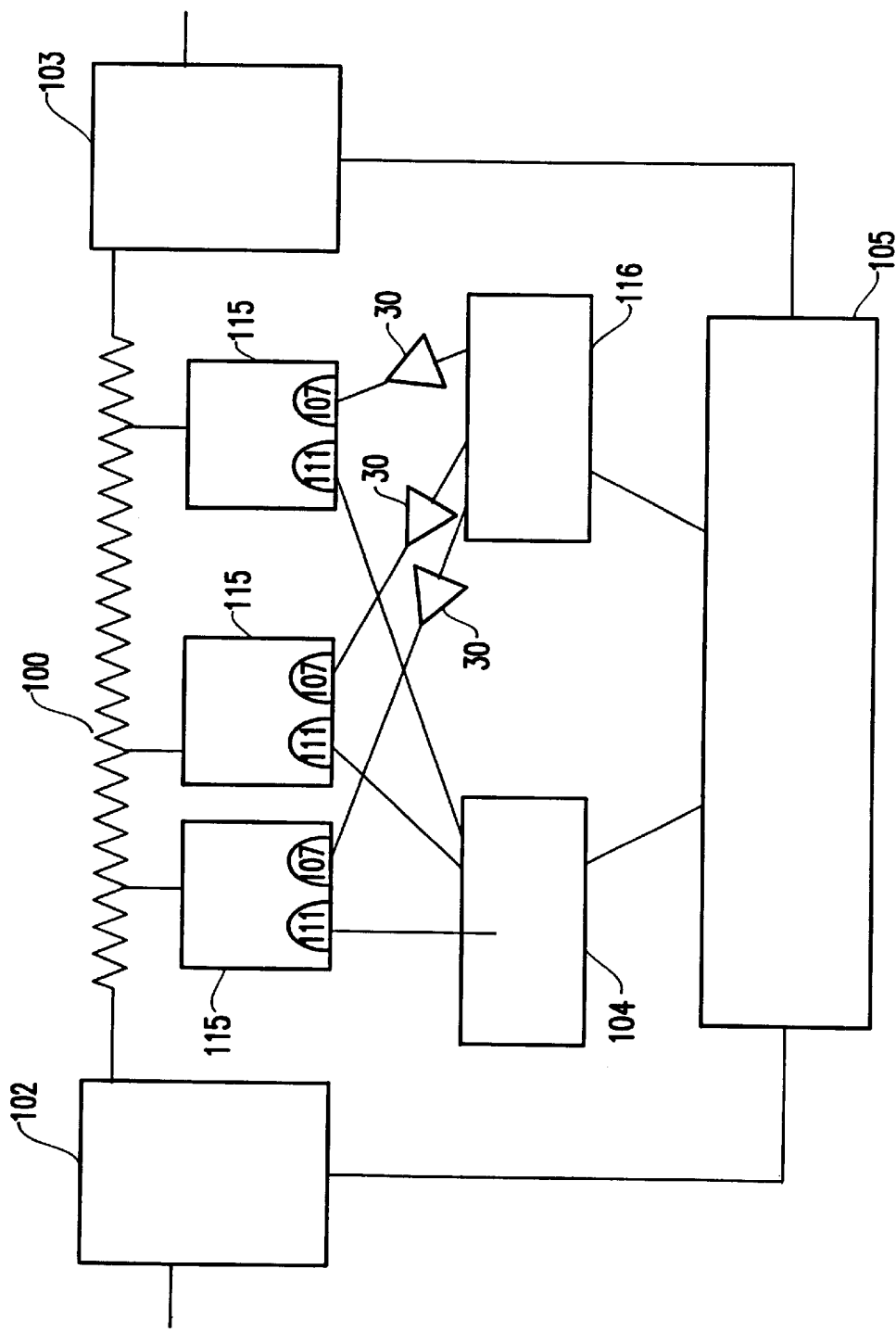
FIG. 3A is a schematic diagram of a structure using a D/A converter and delay control circuits.

FIG. 3A illustrates one embodiment of the invention that has a very precise means of control voltage Vc variation using digital to analog (D/A) converters 30. The capacitance modulating circuit 116 inputs signals to the D/A converters 30 which results in precise Vc control and accurate control of capacitance modulation of Cdep. While FIG. 3A shows three D/A converters 30 connected only to the second capacitance modulating circuit 116, as would be known by one ordinarily skilled in the art, it is possible to use a single converter (e.g., connected to the delay control circuit 105 or to alternatively (or additionally) include D/A converters 30 connected to the lines extending from the first capacitance modulating circuit 104, or connected directly to delay contact circuit 112, thereby eliminating the separate modulation circuits 104 and 116 (FIG. 3B).

Figure 4:
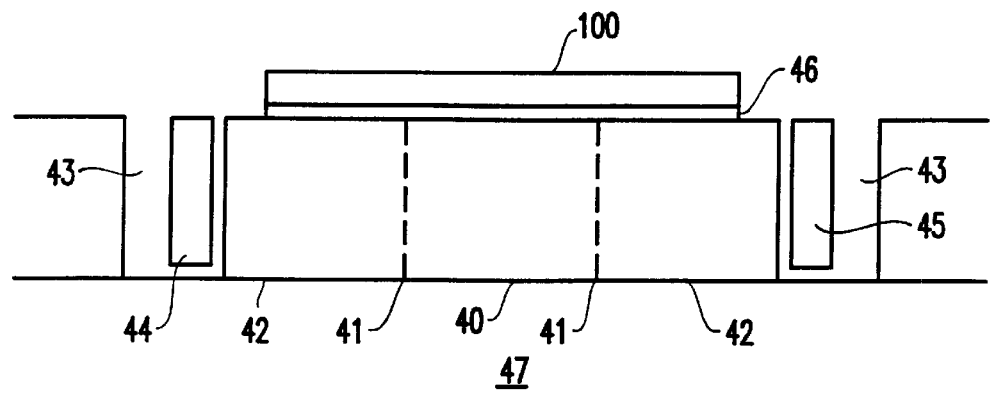
FIG. 4 is a schematic diagram of a structure having multiple control gates in trenches.

FIG. 4 illustrates an alternative embodiment of the invention wherein the transmission line 100 is over a gate oxide 46, a P—region 40 and a P+ substrate 47. The P—region 40 is bordered by depleted regions 42. FIG. 4 also illustrates control gates 44, 45 within trenches 43.

With the structure shown in FIG. 4, voltage can be applied independently to each of the control gates 44, 45 to control the depletion boundary layer 40. The depletion boundaries 41 move laterally below the transmission line depending upon the voltage applied by each of the control gates 44, 45. The depletion boundaries 41 may merge when voltage is applied to both control gates 44, 45. The depletion region is preferably continuous along the transmission line, unless the control gates are segmented. The variation in capacitance can be gradual between the extremes as a function of the lateral motion of the depleted regions.

When maximum voltage is applied to the control gates 44, 45, as described above, the capacitance of the transmission line 100 would be equal to 1/10 the capacitance of the gate oxide 46. At the other extreme, if the channel region below the transmission line is not depleted because no voltage is applied to either of the control gates 44, 45, the capacitance of the transmission line 100 would be approximately equal to the capacitance of the gate oxide 46. Thus, with the structure shown in FIG. 4, the capacitance of the transmission line 100 can be varied by approximately a factor of 10.

The structure shown in FIG. 4 also allows the transmission line 100 to carry substantially lower voltage when compared to the structure shown in FIGS. 2B. The depleted region 114 in FIG. 2B is formed by the voltage of the transmission line 100. Therefore, the transmission line 100 in FIG. 2A must carry sufficient voltage to create the depletion region 114. To the contrary, with the structure in FIG. 4, the depletion region is created by the control gates 44, 45. A deeper trench with corresponding deeper control gates 44, 45 also creates deeper depleted regions 42 and therefore a smaller depletion capacitance (less than the gate oxide layer 46).

Figure 5:
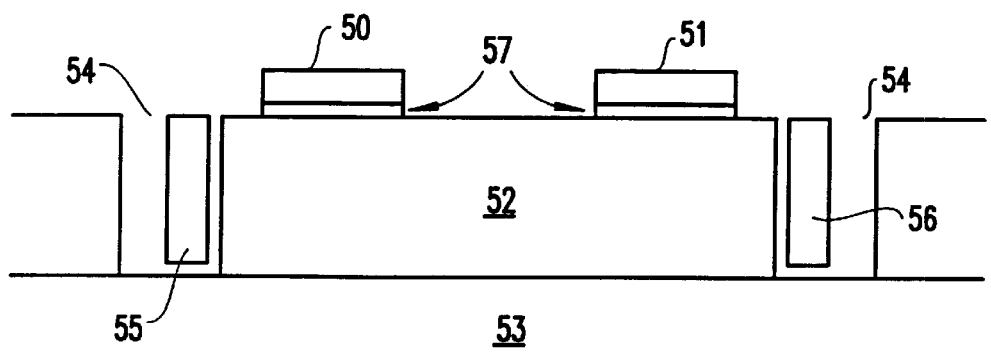
FIG. 5 is a schematic diagram of a structure having multiple transmission lines and control gates in trenches.

FIG. 5 illustrates a structure which is similar to that shown in FIG. 4 and includes trenches 54, control gates 55, 56, and a P+ substrate 53. However, the structure in FIG. 5 includes two transmission lines 50, 51 and a lightly doped P region 52 which exists along the entire length between the trenches 54. The operation of varying the capacitance of the transmission lines 50, 51 is similar to the previous embodiments of the invention. However, each of the control gates 55, 56 will independently vary the capacitance of the adjacent transmission line 50, 51. Therefore, for example, applying voltage to control gate 56 will lower the capacitance (to 1/10 the capacitance of the gate oxide 57) of the transmission line 51 and not affect the transmission line 50. Thus, the pairs of transmission lines 50, 51 can be independently modulated by independently supplying voltage to the control gates 55, 56.

Thus, for example, the capacitance values of the combinations of transmission line pairs are as follows:

| Options | Transmission Line 1 | Transmission Line 2 |
| --- | --- | --- |
| 1 | Cox | Cox |
| 2 | Cox | Cdep |
| 3 | Cdep | Cox |
| 4 | Cdep | Cdep |

The above table shows four combinations where the capacitance of each line is at a high or low capacitance extreme. However, it is possible for each line to have both capacitance of the oxide and capacitance of the depletion region regions modulated continuously.

Figure 6A:
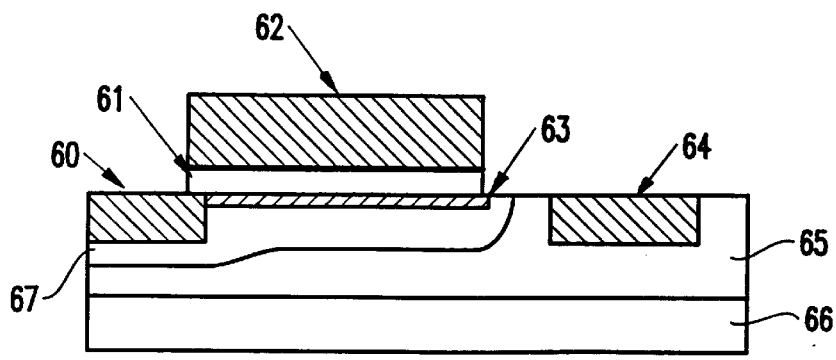
FIG. 6A is a schematic diagrams of a three terminal varactor.
Figure 6B:
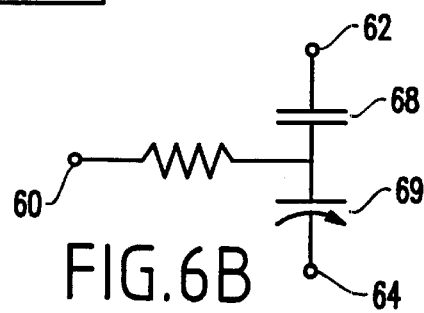
FIG. 6B is a schematic diagrams of a three terminal varactor.

Another embodiment of the invention, which is illustrated in FIGS. 6A–6B, is a three terminal varactor. More specifically, FIG. 6A illustrates a contact 60 (e.g., a heavily n+ doped (e.g., $10^{19}$ cm$^{-3}$) silicon cathode), a thin insulator (e.g., oxide) layer 61, a gate conductor 62, an inversion layer 63, a second contact 64 (e.g., a p+ doped silicon anode), a first well region 65 (e.g., p−) and a substrate 66 (e.g., p+ silicon). The structure shown in FIG. 6A is formed using substantially the same processes and materials for the previous embodiments, discussed above and incorporates all the features and embodiments of the invention discussed above.

Conventional varactors have two terminals (e.g. a cathode and an anode) one of which is commonly connected to a transmission line. When a conventional varactor diode is reverse biased (e.g., by the signal line) it has a capacitance which varies based on the bias. For example, the varactor diode may delay the propagation of a signal across a transmission line as a function of the capacitance by changing the propagation constant of the transmission line. Conventional varactors therefore require modulation of the voltage along the transmission line to reverse bias the varactor.

To the contrary, the capacitance of the inventive three terminal varactor can be controlled by altering the voltage applied to the cathode and the anode without requiring modulation of the voltage of the transmission line (other than requiring a minimum bias to maintain the inversion region, as discussed below).

The three terminal varactor is designed to have the gate 62 (e.g., transmission line) operate at a voltage in excess of the highest voltage Vc which would be applied to the control cathode 60 plus a threshold voltage Vt of the transistor. By maintaining such a voltage, the inversion layer 63 will be maintained beneath the gate insulator 61. In this way the bias applied to the transmission line controls a capacitance range between the receiving terminal (e.g., transmission line) and the anode terminal, while the cathode (e.g., control terminal) adjusts the capacitance of the transmission line within this capacitance range. The combined resistance of the inversion layer 63 and the diffusion region 60 is sufficiently large to allow the gate oxide 61 capacitance and the depletion region 60 capacitance to be coupled at the frequency of the signal being propagated on the transmission line 62.

Therefore, the gate electrode 62 (FIG. 6B) will have a high capacitance 68 to the inversion layer 63 and the inversion layer 63 will, in turn, have a capacitance 69 to the substrate 66 which is determined by the width of the depletion region 67 between the inversion layer 63 and the substrate 65. With the above structure, the net capacitance 69 of the gate electrode 62 (transmission or signal line) to the substrate 65 is modulated by the voltage between the control cathode 60 and the anode 64 because the depletion width 67 is determined by the voltage between the inversion layer 63 and the substrate 65.

In other words, the inventive three terminal varactor allows the capacitance 69 between the transmission line (e.g., receiving terminal) 62 and the anode 64 to be controlled uniquely by the voltage difference between the control cathode 60 and the anode 64 as long as the inversion region is maintained (e.g., the voltage of the transmission line Vg is greater that the voltage applied to the control cathode Vc and the control anode plus the threshold voltage Vt of the device).

The structure discussed in this application can be formed of any of a wide range of materials using a wide range of processes. For example, the substrate 110 could comprise a semiconductor substrate (heavily or lightly doped) and the contacts 107, 111 could be formed by implanting an impurity (such as a P-type impurity (e.g., boron) or an N+ impurity (e.g., arsenic)) into the substrate using, for example, an ion implantation process. Similarly, the insulator 101 could be an oxide or nitride and the conductor 100 could be a metal, alloy or polysilicon, both of which could be deposited using conventional techniques such as sputtering, chemical vapor deposition, etc. and patterned using, for example, conventional lithographic masking and etching techniques. The structure shown in FIGS. 4–6 are similarly formed using techniques well known to those ordinarily skilled in the art. For example, the trenches 43 may be formed using conventional masking and etching techniques. As would be known to one ordinarily skilled in the art given this disclosure, the inventive structures described herein are readily formed using conventional processes and techniques and the invention is not limited to the materials or processes mentioned herein. Instead, the invention is applicable to any and all material and methods commonly used in this art field.

Additionally, while the previous embodiments are described in terms of resistance/capacitance (RC) transmission lines, as would be known by one ordinarily skilled in the art given this disclosure, it is possible to coat a polysilicon transmission line with metal to build a low resistance line. With such a structure, the conductors are smaller in cross section, with a fixed inductance (L) per unit length and a modulated capacitance (C). This results in a highly useful variable inductance/capacitance (LC) transmission line.

While the invention has been described in terms of preferred embodiments, those skilled in the art will recognize that the invention can be practiced with modification within the spirit and scope of the appended claims.

What is claimed is:

1. A variable capacitance transmission line structure comprising:
   a substrate;
   an insulator above a portion of said substrate;
   a transmission line above said insulator;
   at least two contact regions in said substrate on opposite sides of said portion of said substrate, wherein a voltage between said at least two contact regions modulates a capacitance of said transmission line; and
   a delay control circuit supplying said voltage to said at least two contact regions,
   wherein one of said at least two contact regions comprises a region of said substrate doped with a first impurity and another of said at least two contact regions comprises a region of said substrate doped with a second impurity opposite said first impurity.

2. A semiconductor structure comprising:
   a substrat;
   an insulator above a portion of said substrate;
   a conductor above said insulator; and
   at least two contact regions in said substrate, wherein a voltage between said at least two contact regions modulates a capacitance of said conductor,
   wherein said substrate includes an inversion region below said insulator and a depletion region below said inversion region, wherein said voltage modulates a capacitance of said inversion region.

3. The semiconductor structure in claim 2, wherein said capacitance of said conductor is equal to said capacitance of said inversion region in series with a capacitance of said insulator.

4. A semiconductor structure comprising:
   a substrate;
   an insulator above a portion of said substrate;
   a conductor above said insulator; and
   at least two contact regions in said substrate, wherein a voltage between said at least two contact regions modulates a capacitance of said conductor,
   wherein one of said at least two contact regions comprises a region of said substrate doped with a first impurity and another of said at least two contact regions comprises a region of said substrate doped with a second impurity opposite said first impurity.

5. A semiconductor structure comprising:
   a substrate;
   an insulator above a portion of said substrate;
   a conductor above said insulator; and
   at least two contact regions in said substrate, wherein a voltage between said at least two contact regions modulates a capacitance of said conductor, wherein:
      said at least two contact regions comprise respective contact conductors in corresponding trenches adjacent said portion of said substrate;
      said portion of said substrate includes an impurity region between said trenches; and
      said impurity region comprises a depletion region adjacent said trenches.

6. The semiconductor structure in claim 5, wherein boundaries of said depletion region are controlled by said voltage applied through said at least two contact regions to said respective contact conductors.

7. The semiconductor structure in claim 5, wherein said conductor comprises a plurality of conductors above said portion of said substrate and said voltage applied through said at least two contact regions to said respective contact conductors independently varies a capacitance of different portions of said depletion region.

8. An integrated circuit chip comprising:
   a signal line carrying signals and having a delay associated with it;
   at least one charge region having a controllable charge density near the signal line; and
   a modulation circuit coupled to the charge region for dynamically controlling the charge density in the charge region for adjusting the delay associated with the signal line,
   wherein said charge region includes an inversion region adjacent said signal line, wherein said modulation circuit modulates a capacitance of said inversion region.

9. The integrated circuit chip in claim 8, wherein a capacitance of said signal line is equal to said capacitance of said inversion region in series with a capacitance of an insulator adjacent said signal line.

10. A variable capacitance transmission line structure comprising:
    a substrate;
    an insulator above a portion of said substrate;
    a transmission line above said insulator;
    at least two contact regions in said substrate on opposite sides of said portion of said substrate, wherein a voltage between said at least two contact regions modulates a capacitance of said transmission line; and
    a delay control circuit supplying said voltage to said at least two contact regions,
    wherein said substrate includes an inversion region below said insulator and a depletion region below said inversion region, wherein said voltage modulates a capacitance of said inversion region.

11. The variable capacitance transmission line structure in claim 10, wherein said capacitance of said transmission line is equal to said capacitance of said inversion region in series with a capacitance of said insulator.

12. A variable capacitance transmission line structure comprising:
    a substrate;
    an insulator above a portion of said substrate;
    a transmission line above said insulator;
    at least two contact regions in said substrate on opposite sides of said portion of said substrate, wherein a voltage between said at least two contact regions modulates a capacitance of said transmission line; and a delay control circuit supplying said voltage to said at least two contact regions, wherein:

said at least two contact regions comprise respective contact conductors in corresponding trenches adjacent said portion of said substrate;

said portion of said substrate includes an impurity region between said trenches; and said impurity region comprises a depletion region adjacent each of said trenches.

13. The variable capacitance transmission line structure in claim 12, wherein boundaries of said depletion region are controlled by said voltage applied through said at least two contact regions to said respective contact conductors.

14. The variable capacitance transmission line structure in claim 12, wherein said transmission line comprises a plurality of transmission lines above said portion of said substrate and said voltage applied through said at least two contact regions to said respective contact conductors independently varies a capacitance of different portions of said depletion region.

* * * * *